US012566133B2

(12) United States Patent
Atia et al.

(10) Patent No.: US 12,566,133 B2
(45) Date of Patent: Mar. 3, 2026

(54) LINE FIELD SWEPT SOURCE OCT SYSTEM AND SPECTROSCOPY SYSTEM

(71) Applicant: KineoLabs, Inc., Billerica, MA (US)

(72) Inventors: Walid A. Atia, Jamaica Plain, MA (US); Dale C. Flanders, Lexington, MA (US)

(73) Assignee: KineoLabs, Inc., Billerica, MA (US)

( * ) Notice: Subject to any disclaimer, the term of this patent is extended or adjusted under 35 U.S.C. 154(b) by 246 days.

(21) Appl. No.: 18/184,019

(22) Filed: Mar. 15, 2023

(65) Prior Publication Data

US 2023/0296508 A1 Sep. 21, 2023

Related U.S. Application Data

(60) Provisional application No. 63/319,973, filed on Mar. 15, 2022.

(51) Int. Cl.
| | |
|---|---|
| *G01N 21/39* | (2006.01) |
| *G01B 9/02091* | (2022.01) |
| *H01S 3/10* | (2006.01) |
| *H01S 5/02253* | (2021.01) |
| *H01S 5/50* | (2006.01) |

(52) U.S. Cl.
CPC ......... *G01N 21/39* (2013.01); *G01B 9/02091* (2013.01); *H01S 3/1003* (2013.01); *H01S 5/02253* (2021.01); *H01S 5/5036* (2013.01); *H01S 5/5045* (2013.01); *G01N 2201/06113* (2013.01); *G01N 2201/0633* (2013.01); *G01N 2201/105* (2013.01)

(58) Field of Classification Search
CPC ......... G01N 21/39; G01N 2201/06113; G01N 2201/0633; G01N 2201/105; G01B 9/02091; G01B 9/02004; H01S 3/1003; H01S 5/02253; H01S 5/5036; H01S 5/5045; H01S 5/0071; H01S 5/005; H01S 5/101; H01S 5/1085; H01S 5/141; H01S 3/1062; G01J 3/10; G01J 3/42
See application file for complete search history.

(56) References Cited

U.S. PATENT DOCUMENTS

| | | | |
|---|---|---|---|
| 4,079,404 | A | 3/1978 | Comerford et al. |
| 5,077,747 | A | 12/1991 | Hemmer et al. |
| 5,912,910 | A | 6/1999 | Sanders et al. |
| 6,556,599 | B1 | 4/2003 | Svilans |
| 7,671,981 | B1 | 3/2010 | Atia et al. |
| 8,537,865 | B1 | 9/2013 | Shou |
| 8,823,954 | B2 | 9/2014 | Xu |
| 2002/0063160 | A1 | 5/2002 | Krichever et al. |

(Continued)

OTHER PUBLICATIONS

Anna, T. et al., "Simultaneous tomography and topography of silicon integrated circuits using full-field swept-source optical coherence tomography," Journal of Optics. A, Pure and Applied Optics, vol. 11(4), Apr. 1, 2009, 9 pages.*

(Continued)

*Primary Examiner* — Dominic J Bologna
*Assistant Examiner* — Kemaya Nguyen
(74) *Attorney, Agent, or Firm* — HoustonHogle LLP

(57) ABSTRACT

A line field optical coherence tomography (OCT) system and an absorption spectrometer system employing a tunable or swept laser architecture. The laser is a cat's-eye configuration with a preferably transmissive tilt tuned interference thin film filter.

15 Claims, 9 Drawing Sheets

(56)                References Cited

U.S. PATENT DOCUMENTS

| | | |
|---|---|---|
| 2004/0004979 A1 | 1/2004 | Lin |
| 2006/0203859 A1 | 9/2006 | Cable et al. |
| 2007/0071040 A1 | 3/2007 | Flanders et al. |
| 2007/0127539 A1 | 6/2007 | Wang et al. |
| 2008/0175280 A1 | 7/2008 | Bouma et al. |
| 2009/0059971 A1* | 3/2009 | Atia .......................... H01S 5/141 |
| | | 372/20 |
| 2011/0080591 A1* | 4/2011 | Johnson ............. G01B 9/02069 |
| | | 356/519 |
| 2012/0199745 A1 | 8/2012 | Flanders et al. |
| 2014/0104618 A1 | 4/2014 | Potsaid et al. |
| 2014/0340585 A1 | 11/2014 | Heinzelmann et al. |
| 2016/0164255 A1 | 6/2016 | Poustie |
| 2017/0017042 A1 | 1/2017 | Menard et al. |
| 2017/0276471 A1 | 9/2017 | Jiang et al. |
| 2017/0332880 A1 | 11/2017 | Ito |
| 2017/0363415 A1* | 12/2017 | Frisken .............. G01B 9/02004 |
| 2019/0131756 A1 | 5/2019 | Tokuhisa |
| 2020/0232610 A1 | 7/2020 | Raring et al. |
| 2021/0231499 A1* | 7/2021 | Vohra .......................... G01J 3/06 |
| 2022/0013978 A1 | 1/2022 | He et al. |
| 2022/0255284 A1 | 8/2022 | Xu et al. |
| 2023/0268719 A1 | 8/2023 | Mugnier |

OTHER PUBLICATIONS

Delfyett, P.J. et al., "Intracavity Spectral Shaping in External Cavity Mode-Locked Semiconductor Diode Lasers", IEEE Journal of Selected Topics in Quantum Electronics, vol. 4(2), Apr. 1, 1998, 216-223.*

International Search Report and Written Opinion of the International Searching Authority, mailed on Jul. 3, 2023, from International Application No. PCT/US2023/064365, filed on Mar. 15, 2023. 11 pages.

Partial International Search Report, mailed on Jun. 28, 2023, from International Application No. PCT/US2023/064368, filed on Mar. 15, 2023. 9 pages.

International Search Report and Written Opinion of the International Searching Authority, mailed on Sep. 18, 2023, from International Application No. PCT/US2023/064368, filed on Mar. 15, 2023. 18 pages.

Beica, H.C. et al., "An Auto-Locked Diode Laser System for Precision Metrology", Laser Radar Technology and Applications XXII, Proc. of SPIE vol. 10191, May 5, 2017, 6 pages.

Bilenca, A. et al., "Numerical study of wavelength-swept semiconductor ring lasers: The role of refractive-index nonlinearities in semiconductor optical amplifiers and implications for biomedical imaging applications," Optics Letters, vol. 31, No. 6, Mar. 15, 2006, 760-762.

Fechtig, D.J. et al., "Line-field parallel swept source MHz OCT for structural and functional retinal imaging," Biomedical Optics Express, vol. 6, No. 3, Mar. 1, 2015, 716-735.

Huber, R. et al., "Buffered Fourier domain mode locking: unidirectional swept laser sources for optical coherence tomography imaging at 370,000 lines/s," Optics Letters, vol. 31, No. 20, Oct. 15, 2006, 2975-2977.

Kischkat, J. et al., "Alignment-stabilized interference filter-tuned external-cavity quantum cascade laser", Optics Letters, vol. 39, No. 23, Dec. 1, 2014, 6561-6564.

Kuznetsov, M. et al., "Compact Ultrafast Reflective Fabry-Perot Tunable Lasers for OCT Imaging Applications," Optical Coherence Tomography and Coherence Domain Optical Methods in Biomedicine XIV, Proc. SPIE, 75541F, Feb. 22, 2010, 6 pages.

Lee, S-W. et al., "Line-Field Optical Coherence Tomography Using Frequency-Sweeping Source," IEEE Journal of Selected Topics in Quantum Electronics, vol. 14, No. 1, Jan. 2008, 50-55.

Leitgeb, R.A. et al., "Ultrahigh resolution Fourier domain optical coherence tomography," Optics Express, vol. 12, No. 10, May 17, 2004, 2156-2165.

Potsaid, B. et al., "Ultrahigh speed 1050nm swept source / Fourier domain OCT retinal and anterior segment imaging at 100,000 to 400,000 axial scans per second," Optics Express, vol. 18, No. 19, Sep. 3, 2010, 20029-20048.

Wang, Z. et al., "A 657-nm narrow bandwidth interference filter-stabilized diode laser", Chinese Optics Letters, vol. 9(4), Apr. 10, 2011, 2 pages.

Yun, S.H. et al., "High-speed optical frequency-domain imaging," Optics Express, vol. 11, No. 22, Nov. 3, 2003, 2953-2963.

International Preliminary Report on Patentability mailed on Sep. 26, 2024, from International Application No. PCT/US2023/064365, filed on Mar. 15, 2023. 7 pages.

International Preliminary Report on Patentability mailed on Sep. 26, 2024, from International Application No. PCT/US2023/064368, filed on Mar. 15, 2023. 13 pages.

Vizbaras, A. et al., "Swept-wavelength lasers based on GaSb gainchip technology for non-invasive biomedical sensing applications in the 1.7-2.5 μm wavelength range", Optical Materials Express, vol. 8, No. 10, Oct. 1, 2018. 4834-4849.

International Search Report and Written Opinion of the International Searching Authority, mailed on Oct. 27, 2023, from International Application No. PCT/US2023/070043, filed on Jul. 12, 2023. 12 pages.

Kasai, K. et al., "1.5 μm, mode-hop-free full C-band wavelength tunable laser diode with a linewidth of 8 kHz and a RIN of -130 dB/Hz and its extension to the L-band", Optics Express, vol. 25, No. 18, Sep. 4, 2017, 22113-22124.

Martin, A. et al., "External cavity diode laser setup with two interference filters", Applied Physics B, vol. 122, No. 12, Dec. 2, 2016, 1-6.

Vassiliev, V.V. et al., "Vibration-proof ECDL with an Intracavity Interference Filter", Bulletin of the Lebedev Physics Institute, vol. 46, No. 10, Oct. 1, 2019, 309-313.

International Preliminary Report on Patentability, mailed on Jan. 30, 2025, from International Application No. PCT/US2023/070043, filed on Jul. 12, 2023. 9 pages.

* cited by examiner

Center wavelength

LINE FIELD SWEPT SOURCE OCT SYSTEM AND SPECTROSCOPY SYSTEM

RELATED APPLICATIONS

This application claims the benefit under 35 U.S.C. § 119(e) of U.S. Provisional Application No. 63/319,973, filed on Mar. 15, 2022, which is incorporated herein by reference in its entirety.

BACKGROUND OF THE INVENTION

Optical coherence tomography (OCT) is a cross-sectional, non-invasive imaging modality that is used in many areas of medical imaging. For example, in ophthalmology, OCT has been widely used for imaging the retina, choroid and anterior segment. Functional imaging of the blood velocity and vessel microvasculature is also possible.

Fourier-domain OCT (FD-OCT) has recently attracted more attention because of its high sensitivity and imaging speed compared to time-domain OCT (TD-OCT), which uses an optical delay line for mechanical depth scanning with a relatively slow imaging speed. The spectral information discrimination in FD-OCT is accomplished either by using a dispersive spectrometer in the detection arm (spectral domain or SD-OCT) or rapidly scanning a swept laser source (swept-source OCT or SS-OCT).

Compared to spectrometer-based FD-OCT, swept-source OCT (SS-OCT) has several advantages, including its robustness to motion artifacts and fringe washout, lower sensitivity roll-off and higher detection efficiency.

Many different approaches have been implemented to develop high-speed swept sources for SS-OCT. One approach employs a semiconductor optical amplifier (SOA) based ring laser design (see for example Yun et al "High-speed optical frequency-domain imaging" Opt. Express 11:2953 2003 and Huber et al "Buffered Fourier domain mode locking: unidirectional swept laser sources for optical coherence tomography imaging at 370,000 lines/s," Opt. Express 13, 3513 2005). Short cavity lasers (see for example Kuznetsov et al "Compact Ultrafast Reflective Fabry-Perot Tunable Lasers For OCT Imaging Applications," Proc. SPIE 7554:75541F 2010) are another example. SOA based ring laser designs have been practically limited to positive wavelength sweeps (increasing wavelength) because of the significant power loss that occurs in negative tuning. This has been attributed to four-wave mixing (FWM) in SOAs causing a negative frequency shift in intracavity light as it propagates through the SOA (Bilenca et al "Numerical study of wavelength-swept semiconductor ring lasers: the role of refractive-index nonlinearities in semiconductor optical amplifiers and implications for biomedical imaging applications," Opt. Lett. 31: 760-762 2006).

A commercially available short cavity laser (Axsun Technologies Billerica, MA) in excess of 100 kHz has been reported (see for example Kuznetsov et al "Compact Ultrafast Reflective Fabry-Perot Tunable Lasers for OCT Imaging Applications," Proc. SPIE 7554: 75541F 2010). Short cavity lasers enable a significant increase in sweep speeds over conventional swept laser technology because the time needed to build up lasing from spontaneous emission noise to saturate the gain medium is greatly shortened (R. Huber et al "Buffered Fourier domain mode locking: unidirectional swept laser sources for optical coherence tomography imaging at 370,000 lines/s," Opt. Express 13: 3513 2005). However, the effective duty cycle of the bidirectional sweeping short cavity laser was limited to less than 50% because of the FWM effects mentioned above. The effective repetition rate of the laser is thus limited.

More recently, tunable vertical cavity surface emitting lasers (VCSELs) have been offered by Thorlabs and Axsun Technologies. The short cavities implicit in this technology enables even higher speed sweeping.

Other methods have also been proposed to increase the effective repetition rates of SS-OCT systems including sweep buffering with a delay line, and multiplexing of multiple sources, thereby increasing the duty cycle of the laser. The method used to multiplex these sweeps together may include components that introduce orthogonal polarizations to the sweeps originating from different optical paths. Combining diverse polarizations at a polarization beamsplitter is a very light efficient way of transmitting the light to a single beam path.

Potsaid et al. demonstrated another method to double the effective repetition rate of a swept source laser by buffering and multiplexing the sweep of a single laser source (see Potsaid et al "Ultrahigh speed 1050 nm swept source/Fourier domain OCT retinal and anterior segment imaging at 100,000 to 400,000 axial scans per second" Opt. Express 18: 20029-20048 2010). However, the long fiber spool will cause a significant birefringence to the laser output.

At the same time, other architectures exist for SS-OCT that reduce the performance requirements for the swept laser source. Fechtig, et al. in an article entitled Line-Field parallel swept source MHz OCT for structural and functional retinal imaging, Biomedical Optics Express 716, vol. 6, no. 3, (2015) describes a system that achieves 1 MHz equivalent A-scan rates by combining a lower sweep rate laser with a linear sensor. Even earlier examples exist such as Line-Field Optical Coherence Tomography Using Frequency-Sweeping Source by Lee, et al. in IEEE Journal of Selected Topics in Quantum Electronics, Vol. 14, No. 1, January 2008.

SUMMARY OF THE INVENTION

The present invention concerns a line scan or line field swept source optical coherence tomography system and its tunable or swept laser architecture. It also concerns spectroscopy.

In general, according to one aspect, the invention features an optical coherence tomography system. It comprises a tunable laser, which includes a gain chip; a collimating lens for collimating light from the gain chip, an end reflector, a focusing lens for focusing the collimated light on the end reflector, a thin film bandpass filter between the collimating lens and the focusing lens, and at least one angle control actuator for changing the angle of the thin film filter to the collimated light.

An interferometer, including a reference arm and a sample arm, receives light from the laser, and a sensor detecting an interference signal between light from the reference arm and the sample arm.

In the preferred embodiment, line forming optics between the tunable laser and the interferometer convert the light from the tunable laser into a rectangular profile. An aspect ratio of the light from the line forming optics is at least 10 to 1 and often more like 100 to 1 or more.

The sensor is preferably a line scan sensor with a linear array of at least 512 pixels.

In this configuration, the light from the laser through the interferometer to the sensor can travel entirely in free space to yield a compact and low cost system In a current embodiment, the angle control actuator is a galvanometer such as a servo galvanometer. It can be driven with a sawtooth waveform for scan linearity.

In general, according to another aspect, the invention features an optical coherence tomography system comprising an interference filter tuned laser, an interferometer including a reference arm and a sample arm and receiving light from the laser, and a line scan sensor for detecting an interference signal between light from the reference arm and the sample arm. The light from the laser travels through the interferometer to the sensor travels in free space.

In general, according to another aspect, the invention features a spectroscopy system comprising a tunable laser, including a gain chip; a collimating lens for collimating light from the gain chip, an end reflector, a focusing lens for focusing the collimated light on the end reflector, a thin film bandpass filter between the collimating lens and the focusing lens, and at least one angle control actuator for changing the angle of the thin film filter to the collimated light. The system further includes a sample cell containing a sample, a detector for detecting light from the tunable laser after passing through the sample cell, and a processor that controls the angle control actuator and monitors a time response of the detector to resolve an absorption spectrum of the sample.

In different embodiments, the gain chip is an InP chip and an GaSb chip.

Further, the angle control actuator can be a galvanometer and particularly include a servomechanism such as servo galvanometer. Another option is a motor that continuously spins the thin film bandpass filter.

In examples, the thin film bandpass filter is oriented to receive an S polarization from the gain chip. In other examples, the thin film bandpass filter is oriented to receive an P polarization from the gain chip.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Also, all conjunctions used are to be understood in the most inclusive sense possible. Thus, the word "or" should be understood as having the definition of a logical "or" rather than that of a logical "exclusive or" unless the context clearly necessitates otherwise. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figures 1A, 2A, 2B, 3:
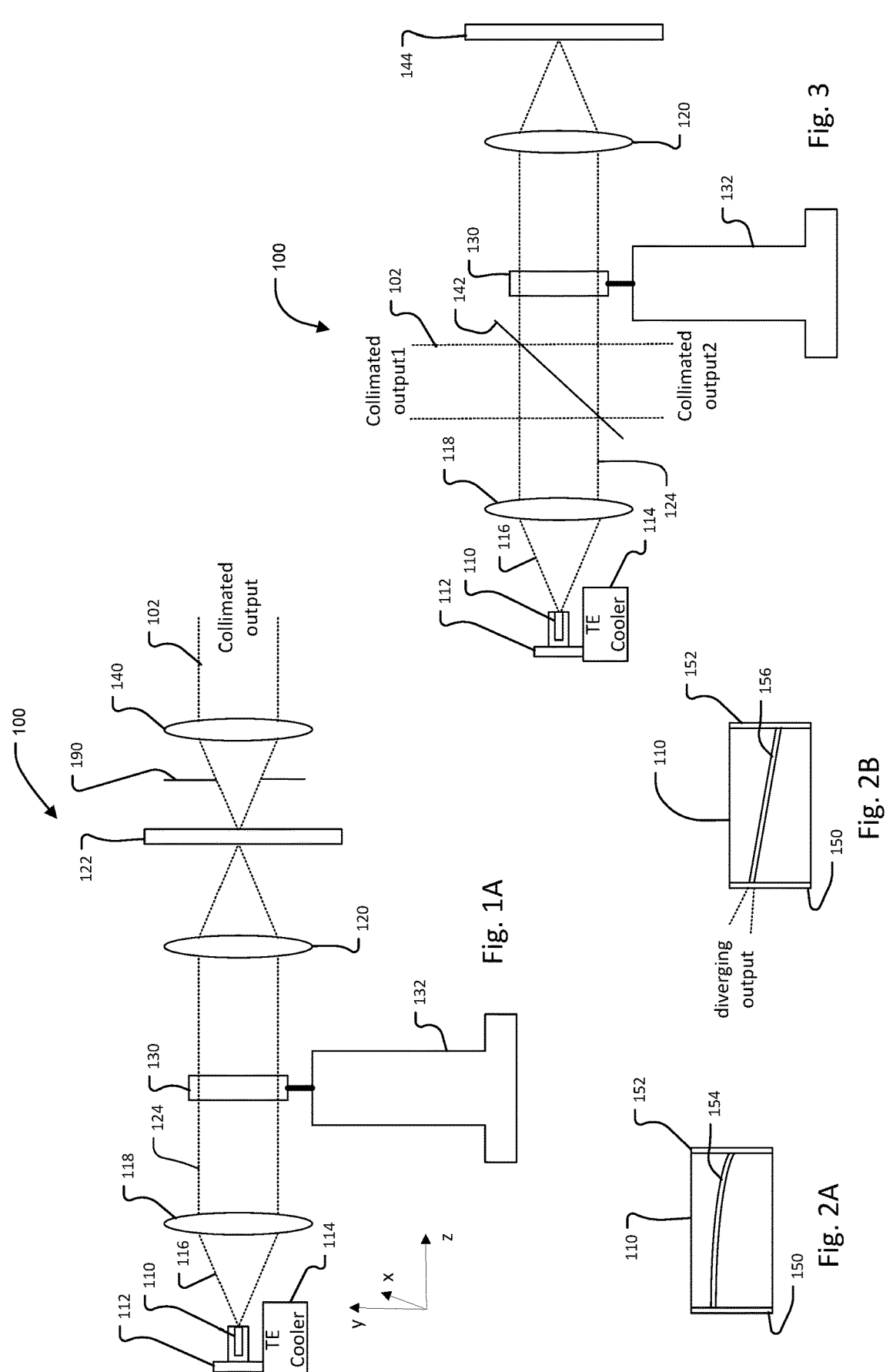
FIG. 1A is a schematic side view of a cat's-eye tunable laser according to the present invention.
FIGS. 2A, 2B, and 2C are schematic top views of gain chips for the tunable lasers.
FIG. 3 is a schematic side view of a cat's-eye tunable laser according to a second embodiment.

FIG. 1A shows a tunable laser 100 that is sometimes referred to as a cat's-eye laser, which has been constructed according to the principles of the present invention.

The laser's amplification is provided by a GaAlAs gain chip 110, in one example. The gain chip 110 amplifies light in the wavelength range of about 800 to 900 nanometers. Preferably its center wavelength is around 840 nanometers, which is useful for applications such as ophthalmic imaging and other diagnostic uses because of the water window (650 to 950 nm) at these wavelengths. Another advantage of this wavelength range is that it can be detected with standard cameras with silicon-based imager chips. Specifically, the output is detected with silicon, e.g., complementary metal-oxide-semiconductor (CMOS) or charge-coupled device CCD, imagers.

Other material systems can be selected for the gain chip, however. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2500 nm, including longer wavelength ranges extending into multiple micrometer wavelengths. Semiconductor quantum well, quantum cascade and quantum dot gain regions are typically used to obtain especially wide gain and spectral emission bandwidths, and support operation up to 250 $\mu$m in wavelength. Quantum well layers may be purposely strained or unstrained depending on the exact materials and the desired wavelength coverage.

In the preferred current embodiment, the gain chip 110 is mounted in a TO-can type hermetic package 112. This protects the chip 110 from dust and the ambient environment including moisture. In some examples, the TO-can package has an integrated or a separate thermoelectric cooler 114.

The free space beam 116 from the package 112 is diverging in both axes (x, y). It is collimated by a collimating lens 118. The resulting collimated beam is received by a cat's eye focusing lens 120, which focuses the light onto a cat's eye mirror/output coupler 122. This defines the other end of the laser cavity, extending between the mirror/output coupler 122 and the back/reflective facet of the gain chip 110.

The collimated light 124 between the collimating lens 118 and the cat's eye focusing lens 120 passes through a thin film interference bandpass filter 130. This provides a pass band of approximately 0.3 nanometers (nm) full width at half maximum (FWHM). More generally, its pass band is between 0.2 nm and 0.5 nm FWHM, or more generally between 0.1 nm and 2 nm FWHM. Even more generally, it is between 0.05 nm to 5 nm FWHM.

The bandpass filter is held on an arm of an angle control actuator 132 that changes the angle of the bandpass filter 130 to the collimated light 124. In one example, the angle control actuator is a galvanometer. In other examples, the angle control actuator 132 is a servomotor or an electrical motor that continuously spins the bandpass filter 130 in the collimated beam 124. This allows for tilting of the bandpass filter 130 with respect to the collimated beam 124 to thereby tilt-tune the filter and thus change the passband to scan or sweep the wavelength of the swept laser 100.

Tuning speed specifications for a galvanometer generally range from 0.1 Hz to 50 kHz. For the higher speeds, a 25 kHz resonant galvanometer can be used with bi-directional tuning, but higher and lower speeds can be used. Wavelength tuning speed is usually given in nm/sec, so for a 100 Hz tuning speed ideal for retinal imaging applications where a line-speed camera at 100 kHz will give 1000 sampled bandwidth points and 70 nm tuning range, this would give 70 nm/10 msec=7000 nm/sec. In general, the tuning speed should be between 3,000 nm/sec and 11,000 nm/sec or higher.

For retinal or industrial imaging with low-cost CMOS cameras, 840 nm center wavelength is an ideal water window. The tuning range is usually minimally 30 nm of tuning range. Preferably, the tuning range is closer to 60 nm or 70 nm or more. This provides good resolution of <8 micrometers in air. In general, the tuning range should be between 30 nm and 100 nm.

The size of the collimated beam 124 is important for many applications. As a general rule, a smaller beam results in higher divergence resulting in a larger cone half angle (CHA). This reduces the minimum line width over angle for a tunable filter. In the current embodiment, the collimated beam is preferably not less than, i.e., greater than, 1 millimeter (mm) FWHM and is preferably greater than 2 mm FWHM for retinal OCT application. It can be smaller, however, for many spectroscopy applications in the infrared, visible or ultraviolet. In general, the CHA should be less than 0.04×0.02 degrees and preferably about 0.02×0.01 degrees or less.

The light from the gain chip is polarized. In the common architectures, the polarization is horizontal or parallel to the epitaxial layers of the edge-emitting gain chip 110. In the preferred configuration, the filter is oriented to receive the S polarization in order to maintain narrow line width of the filter as it is tilt tuned. On the other hand, the P polarization broadens drastically at large tilt angles. S polarization has higher loss at larger tilt angles than P. So, the filter design needs to address these issues by providing a low enough loss across the tuning band for S, in the current embodiment.

On the other hand, for spectroscopy, P polarization configurations might be desirable due to the higher powers across the scanband.

In general, the present cat's-eye configuration provides a number of advantages. It provides low loss, low tolerance, repeatable stable operation since it provides for a lower angle wavelength change over grating-based lasers.

The mirror/output coupler 122 will typically reflect about 80% of the light back into the laser's cavity and transmit about 20% of light. More generally, the mirror/output coupler can reflect from 10% to 99% of light (transmitting 90% to 1%, respectively), depending on the output power and laser cavity loss desired. Higher reflectivity results in lower loss cavities and thus wider laser tuning range where gain exceeds loss, but results in lower output power. In typical operation, the mirror/output coupler 122 reflects less than 90%.

In some embodiments, an iris or mask 190 is added typically after the mirror output coupler 122 to clip the beam edge. This reduces power fluctuations as the beam wanders due to refraction in the tilting bandpass filter 130. Preferably, it is between 80% and 95% and preferably about 90% of the beam size.

Typically, the diverging beam from the mirror output coupler 122 is typically collimated with an output collimating lens 140 to form a free space output beam 102.

Figure 1B:
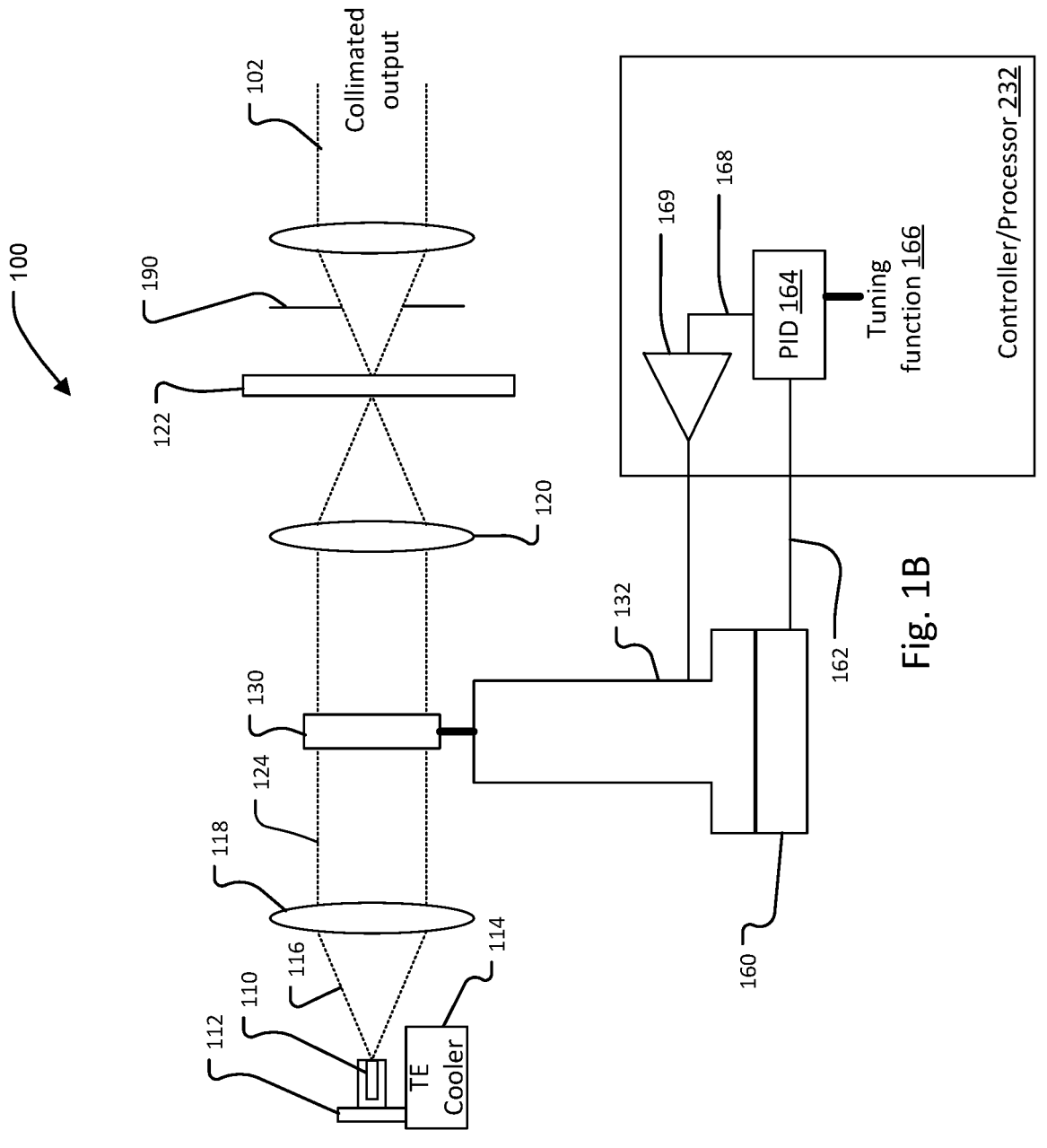
FIG. 1B is a schematic side view of a cat's-eye tunable laser employing a servo galvanometer.

FIG. 1B shows a preferred implementation of the tunable laser 100 and specifically the angle control actuator 132.

The angle control actuator 132 is operated as a servomechanism. In the illustrated embodiment, the angle control actuator 132 is a servo controlled galvanometer with an encoder 160. The encoder 160 produces an angle signal 162 indicating the angle of the galvanometer and thus the filter 130 to the collimated beam 124. Preferably, the encoder is an optical encoder and is often analog.

A controller/processor receives the angle signal 162 at a PID (proportional-integral-derivative) controller 164. The PID controller 164 compares the angle signal 164 to a specified tuning function. Often this is sawtooth or triangular waveform. The PID controller 166 produces the control function 168 that is used to drive the windings of the galvanometer 132 via an amplifier 169.

FIG. 2A shows a preferred gain chip architecture. This chip 110 is termed a single angled facet (SAF) edge-emitting chip. As such, it has a high reflectivity (HR) coated rear facet 150. It has an antireflective (AR) coated front facet 152. In addition, for improved performance, it has a curved ridge waveguide 154 that is perpendicular to the rear facet 150 and is angled at the interface with the front facet 152. This angling at the front facet along with the AR coating reduces reflections at the front facet reflectivity by up to 40 dB and significantly improves laser performance by reducing parasitic reflections that can otherwise lead to non-smooth tuning and mode-hopping.

FIG. 2B shows another potential edge emitting gain chip configuration. The basic configuration is termed a semiconductor optical amplifier (SOA) gain chip. As such, it has an AR coated rear facet and an AR coated front facet. Its straight but angled ridge waveguide 156 intersects with the facets at an angle to minimize reflections back into the chip. In one example, its back facet light is coupled to a lens or pair of lenses and a mirror which reflects light to return through the lens and to the chip. The mirror could be made partially reflecting to take the output out from the back facet.

Figures 2C, 4:
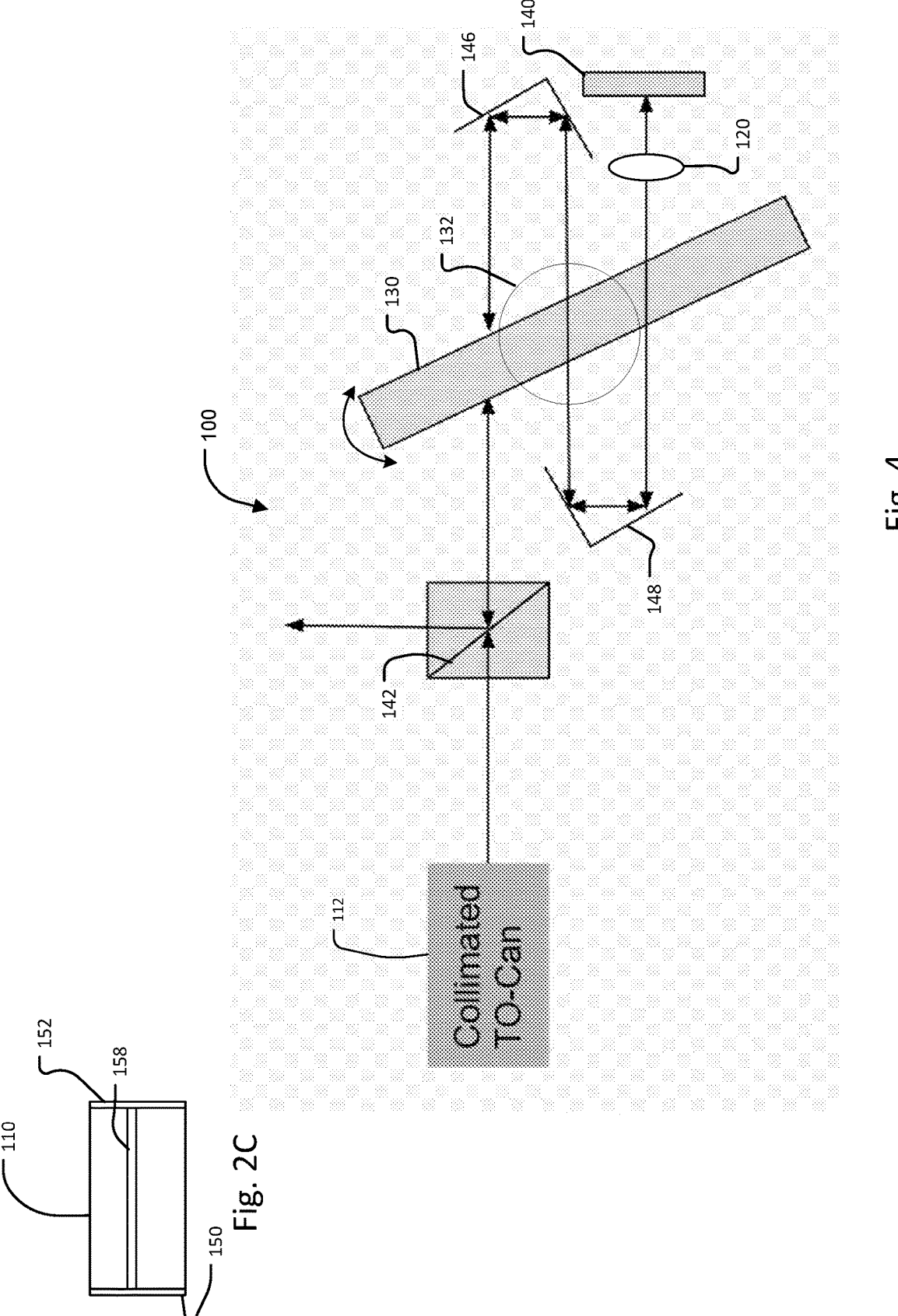
FIG. 4 is a schematic top view of a cat's-eye tunable laser according to third embodiment.

FIG. 2C shows another potential gain chip configuration. The basic configuration is termed a Fabry-Perot gain chip. As such, it has an HR coated rear facet 150 and an AR coated front facet 152. The straight ridge waveguide 158 intersects with the front facet 152 at a perpendicular angle and thus does create some internal reflections that can affect performance.

FIG. 3 shows another example of the laser 100. Here the one or more outputs are taken within the laser's cavity. Specifically, an angled beam splitter 142 picks off part of the light in the laser's cavity as collimated output beams output1 and output2. The end mirror 144 has typically high reflectivity, such as higher than 99%, unless it is used to provide a third output.

As discussed, the output coupler is often implemented as a beam splitter. The output coupling is then chosen by selecting an output coupler with the desired ratio of reflectivity versus transmissivity. Another option is to use the combination of a polarization beam splitter and a quarter waveplate. This allows for adjustability in the output coupling by controlling the angle of the quarter waveplate.

In this configuration, there are actually two outputs: collimated output1 and collimated output2. Generally, collimated output1 will provide higher power since it receives light directly from the chip. This output is also characterized by a higher amplified spontaneous emission (ASE) spectrum. On the other hand, collimated output2 will exhibit a lower higher power, but this output is characterized by a lower spectral sideband since it takes light after double passing through the bandpass filter. Note also that in this configuration the output light's position does not deviate while the filter angle is tuned because the light is reflected back through the filter and retraces itself.

In this example, an integrated k clock is possible. An etalon is added in one output. A trigger signal is then created that a camera can use for efficient sampling without the need for software resampling.

FIG. 4 shows another embodiment of the swept laser. This version provides for a narrowed linewidth for the bandpass filter 130, which is rotated in the plane of the image in the drawing by the rotary actuator 132. Specifically, the light from the TO-can 112 is collimated by an internal lens.

The narrowed linewidth is achieved with a 6-pass arrangement. Specifically, two retroreflectors 146, 148 extend the cavity to include six passes through the bandpass filter pass for each pass through the laser's cavity. In the example shown, an intracavity output coupler 142 is used. But in other examples, a cat's eye mirror/output coupler is used. Other cases include a 4-pass arrangement with cat's eye reflector placed on the same side as the input beam to the bandpass filter.

Figure 5A:
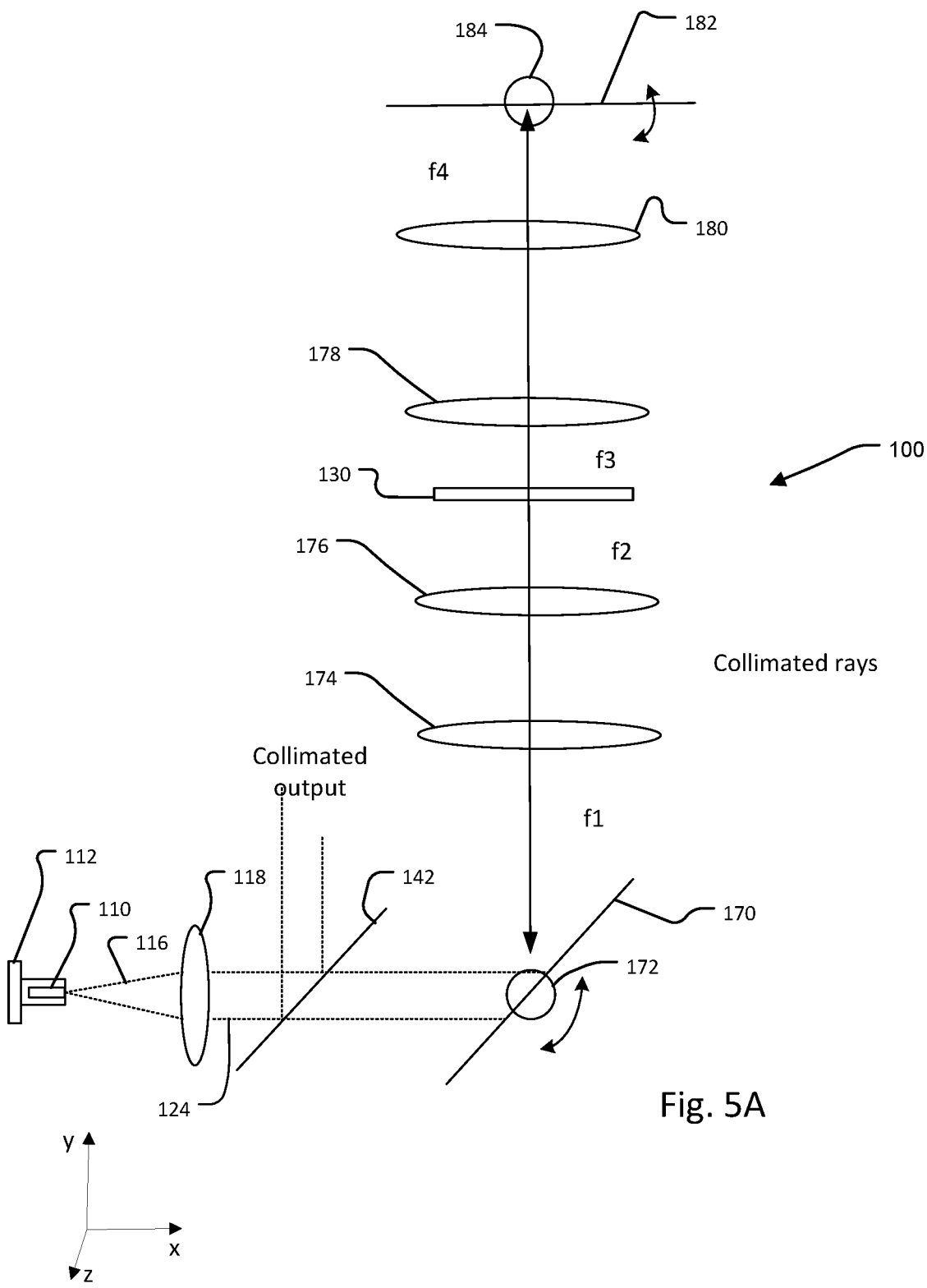
FIG. 5A-5C are a schematic side views of a cat's-eye tunable laser according to fourth embodiment.

FIG. 5A shows another cat's-eye swept or tunable laser embodiment.

The free space beam 116 from the package 112 is collimated by a collimating lens 118. It passes through an optional output coupler beam splitter 142. The resulting collimated beam reflected by a first tilt mirror 170. A first galvanometer 172 controls its tilt angle, which is in the plane of the drawing.

The light is then received by first mirror collection lens 174 that is separated from the first mirror by its focal length f1. A filter focusing lens 176 directs the light through the bandpass filter 130, which is fixed in this example. The filter focusing lens 176 is separated from the bandpass filter 130 by its focal length f2. A filter collection lens 178 collimates the light from the bandpass filter, which is also separated from the bandpass filter 130 by its focal length f3. Then a cat's eye focusing lens 180 focuses the light onto a cat's eye mirror and possible output coupler 182. This cat's eye tilt mirror 182 is held on a second galvanometer 184. The cat's eye focusing lens 180 is separated from the cat's eye tilt mirror 182 by its focal length f4.

Figure 5B:
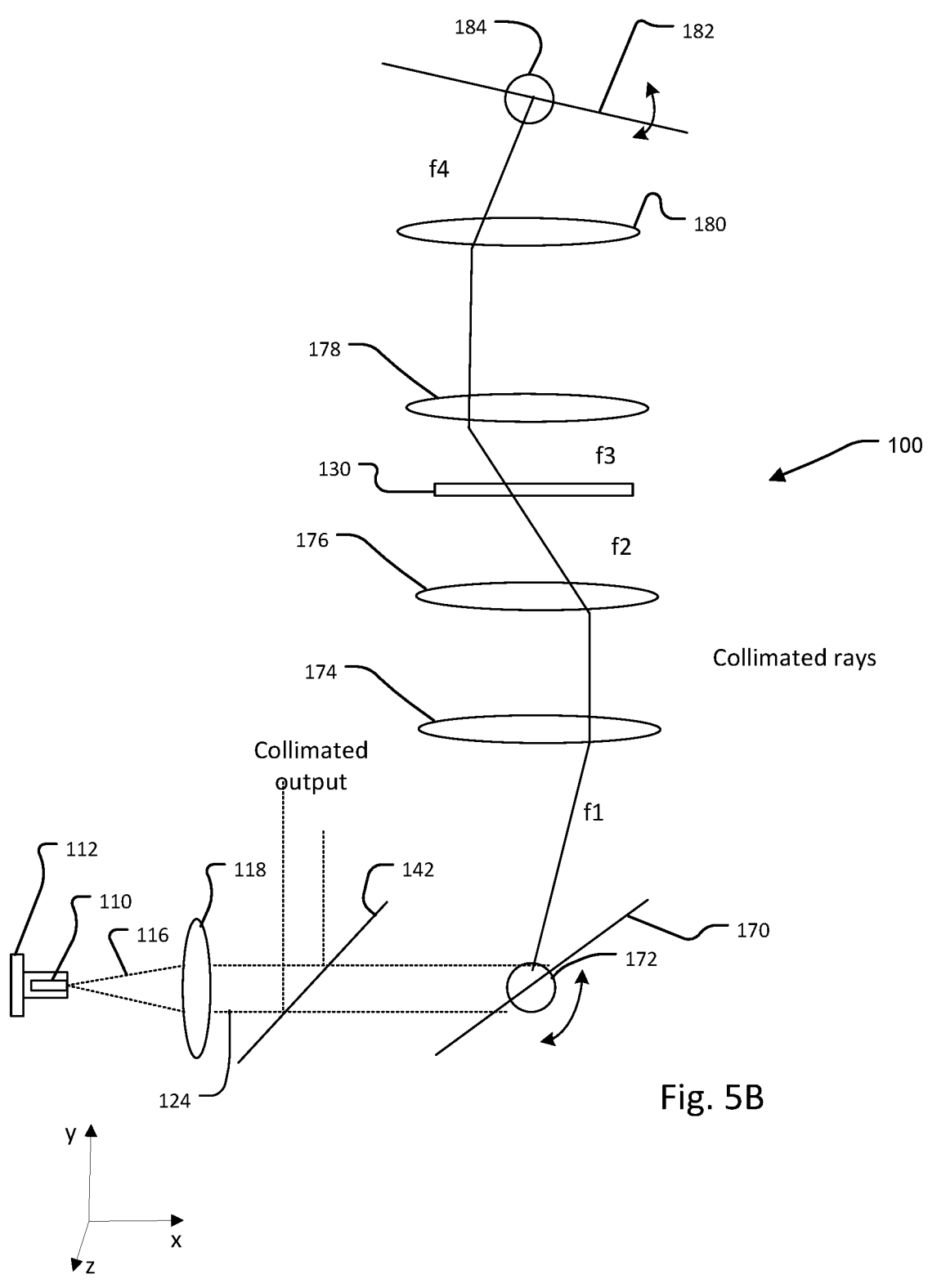

FIG. 5B shows the tunable laser embodiment tuning to a different wavelength. The first and second galvanometers are driven synchronously so that the ray retraces its path. The ray passes through the bandpass filter at an angle to thereby achieve tilt tuning without moving the bandpass filter.

Figure 5C:
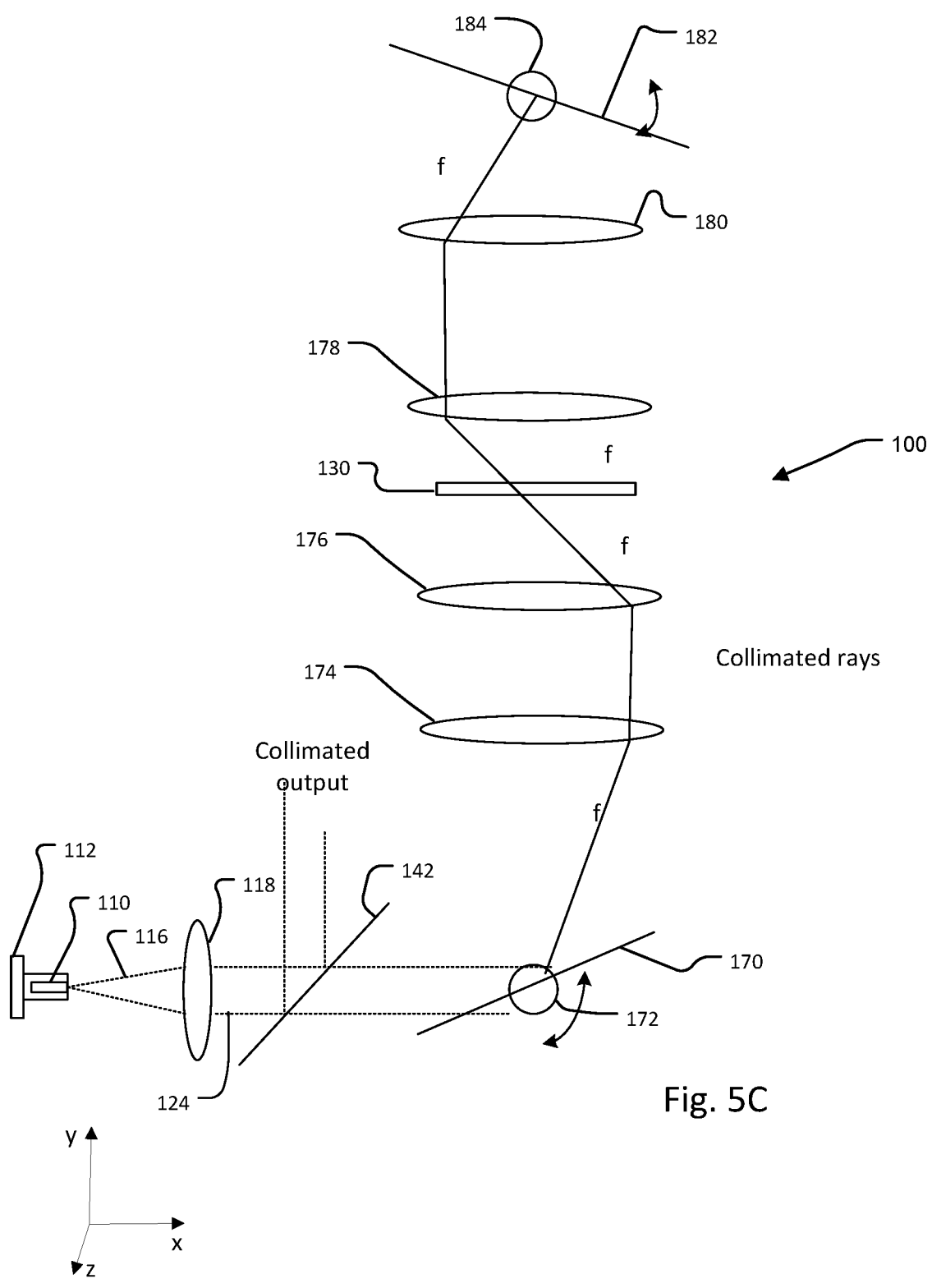

FIG. 5C shows the tunable laser embodiment tuning to still different wavelengths. The first and second galvanometers are again driven synchronously so that the ray retraces its path. The ray passes through the bandpass filter at an even higher angle to thereby achieve further tilt tuning without moving the bandpass filter 130.

Figure 6A:
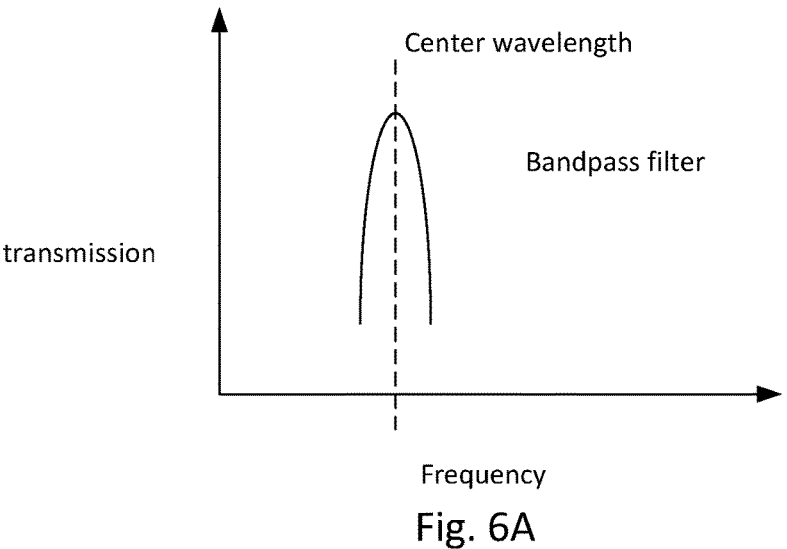
FIG. 6A is a schematic plot of transmission as a function of frequency showing the passband of the bandpass filter.

The collimated light between the collimating lens and the cat's eye focusing lens FIG. 6A is a plot of transmission as a function of frequency for the passband filter at a specified angle. It shows the narrow passband.

Figure 6B:
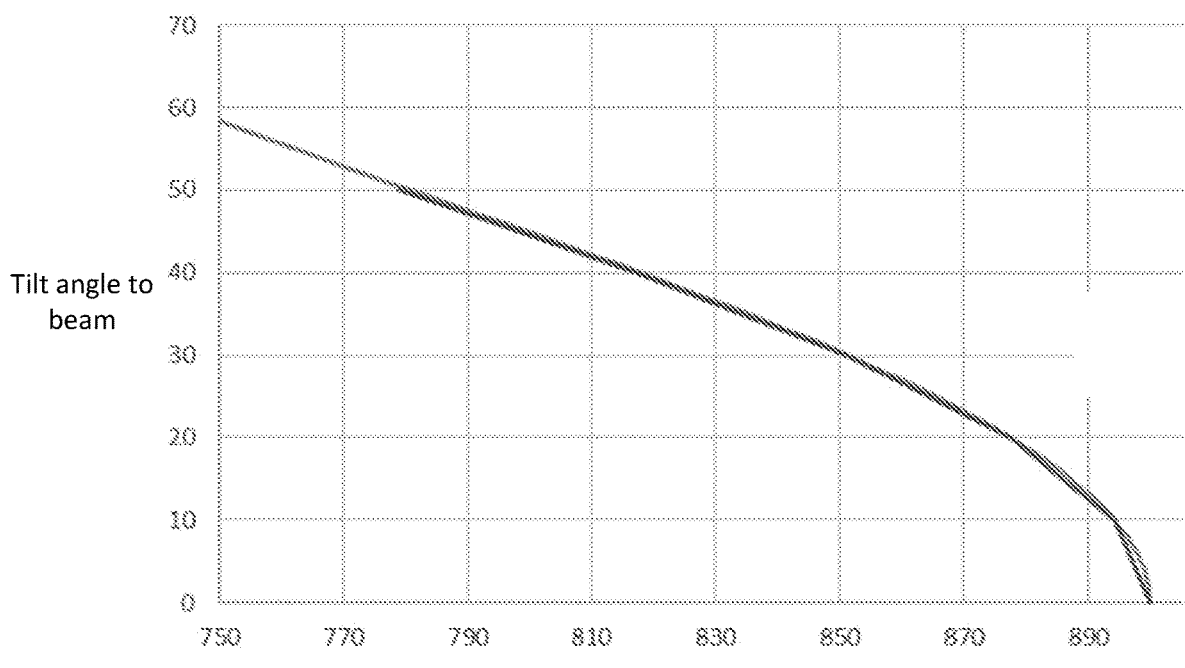
FIG. 6B is a plot of tilt angle as a function of center wavelength for the bandpass filter.

FIG. 6B is a plot of angle of the filter 130 to the beam as a function of the passband wavelength for S polarization. It shows how the passband can be tuned by the galvanometer tilting of the passband filter.

The following formula relates the passband wavelength as a function of the center wavelength with no tilt, and θ, which is the angle between the beam and the filter.

$$\lambda_\theta = \lambda_o \sqrt{1 - \left(\frac{n_o}{n_{eff}} \sin\theta\right)^2}$$

The forgoing formula shows how the filter exhibits a slow tilt angle at low angles then gets faster. Operation is preferable in the more linear region to minimize the required tilt angle and have a more linear scan. The illustrated filter function is for a laser operating in the 810-870 nm tuning range. So 900 nm is chosen for 0 degree incidence wavelength. Thus, it will have the smallest operating angle around 870 nm and tune from 810-870 nm. Note that angle tuning always reduces the wavelength. $N_{eff}$ is adjustable and can be helpful to amplify the tuning with angle.

Figure 7:
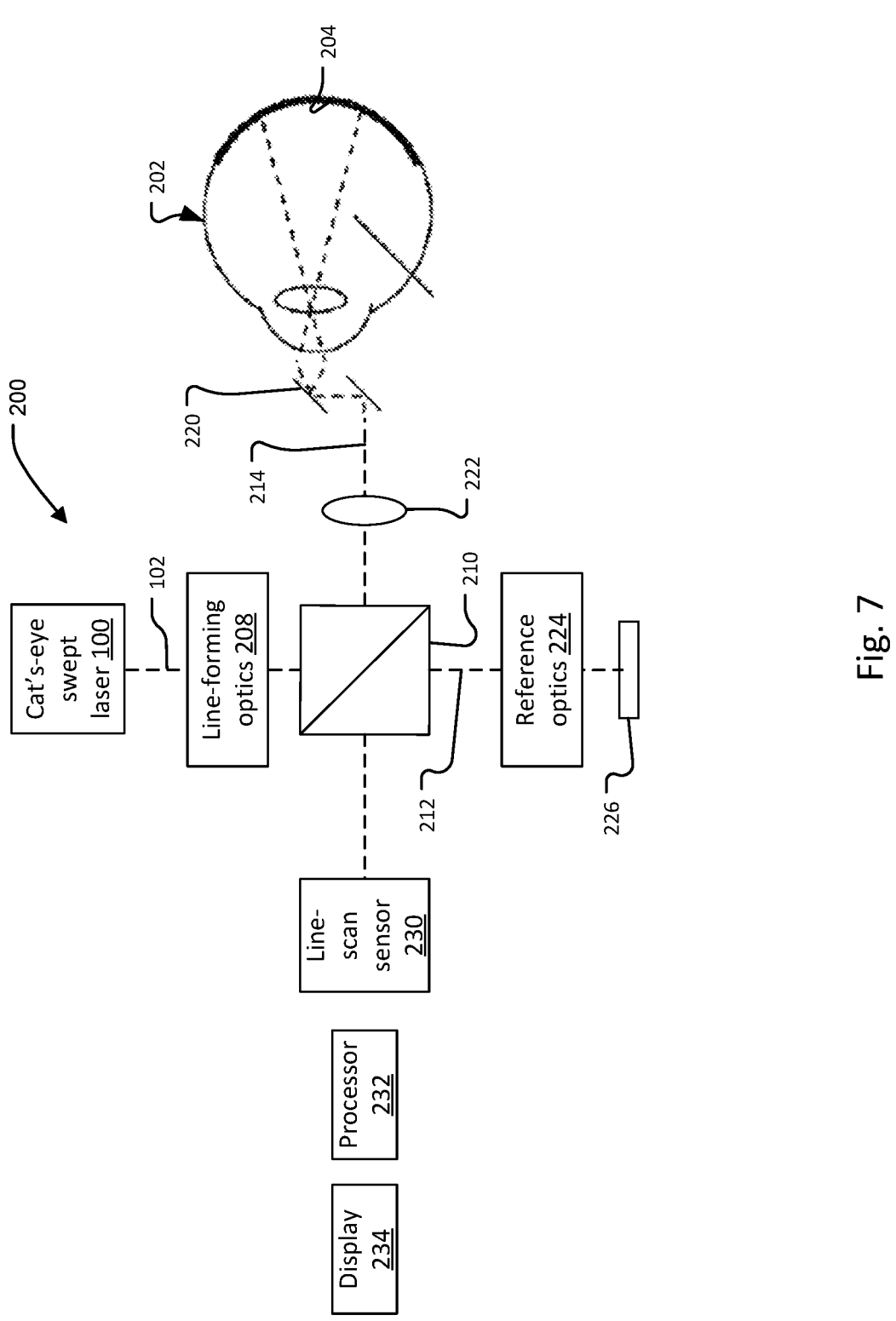
FIG. 7 is a schematic view of a swept source OCT system to which the tunable lasers are applicable.

FIG. 7 shows a swept-source optical coherence tomography system (SS-OCT) 200. In the illustrated example, the OCT system 200 is employed for ophthalmic analysis of a human eye 202 and specifically the retina 204.

The OCT system 200 includes the cat's-eye swept laser 100, preferably with the servo galvanometer to provide highly repeatable swept source operation. Light in the form of free space beam 102 from the laser 100 passes in free space to line-forming optics 208 and then to a beamsplitter 210, such as a cube beamsplitter, of the OCT interferometer.

Typically, the line-forming optics 208 includes one or more cylindrical lenses and possibly several additional lenses in a beam expander configuration. The line forming optics 208 converts the light from the laser 100 into a line or more specifically a rectangular profile with an aspect ratio of at least 10 to 1 and typically greater than 100:1, and often 400:1, or more. That is, when looking along its optical axis, the light from the line-forming optics 208 has a line or more specifically a rectangular two-dimensional profile that is at least 10 times longer in one dimension than the other dimension.

The beamsplitter 210 divides the light between the reference arm 212 and the sample arm 214 in the illustrated Michelson arrangement. The light propagates in free space between one or more lenses that form projection and collection optics 222 in the sample arm and illuminates the sample 202, a typical sample being tissues, e.g. retina, 204 in the human eye.

The light is scanned across the sample, typically with a galvanometer driven scanning mirror 220 between beamsplitter 210 and the sample 202. The scanning mirror scans so that the beam of light is moved in the direction that is orthogonal to the major axis of the rectangular beam profile.

Light in the reference arm is conditioned by one or more lenses of reference arm optics 224 and reflected by reference mirror 226.

The collected sample light received back through the projection and collection optics 222 is combined with reference arm light to form light interference in a line-scan sensor 230. The line scan sensor typically has a linear array of at least 512 pixels, and often at least 1024 or 2048 pixels.

An important aspect of the illustrated example is that the light from the cats-eye swept laser 100 through the OCT interferometer to the line-scan sensor 230 travels in free space between the cube beamsplitter 210, and the lenses of the line-forming optics 208, collection optics 222, reference arm optics 224 in freespace. No waveguides, such as optical fiber, are present.

The output from the sensor 230 is readout by a processor 232. The results can be stored in the processor and/or displayed on display 234. The Fourier transform of the interference light reveals the profile of scattering intensities at different path lengths, and therefore scattering as a function of depth (z-direction) in the sample (see for example Leitgeb et al, "Ultrahigh resolution Fourier domain optical coherence tomography," Optics Express 12(10):2156 2004). The profile of scattering as a function of depth is called an axial scan (A-scan). A set of A-scans measured at neighboring locations in the sample produces a cross-sectional image (tomogram or B-scan) of the sample. A collection of B-scans makes up a data cube or cube scan.

Figure 8:
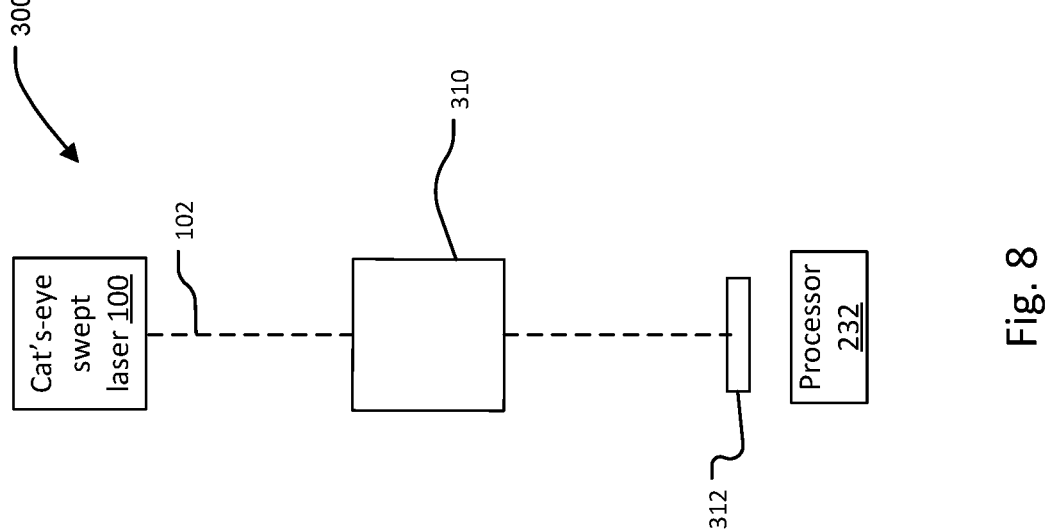
FIG. 8 shows a tunable laser spectrometer 300 employing the cat's-eye swept laser 100.

FIG. 8 shows a tunable laser spectrometer 300 employing the cat's-eye swept laser 100. Typically, the chip is an InP or GaSb SAF chip 110.

Here, the free space beam 102 from the cat's-eye swept laser 100 illuminates a sample, such as a gas or liquid in a sample cell 310. The light from the sample cell is detected by detector 312.

The processor 232 controls the sweeping of the tunable laser and particular its servo galvanometer through the laser's tuning range. Preferably, the tuning range is 20 nm or more. More than 60 nm or more than 70 nm is typically preferred. In general, the tuning range should be between 50 nm and 300 nm. At the same time, the processor 232 monitors the time response of the detector 312 to thereby resolve the absorption spectrum of the sample in the sample cell 310.

While this invention has been particularly shown and described with references to preferred embodiments thereof, it will be understood by those skilled in the art that various changes in form and details may be made therein without departing from the scope of the invention encompassed by the appended claims.

What is claimed is:

1. An optical coherence tomography system, comprising:
    a tunable laser, including a gain chip; a collimating lens for collimating light from the gain chip, an end reflector, a focusing lens for focusing the collimated light on the end reflector, a thin film bandpass filter between the collimating lens and the focusing lens, a galvanometer for changing an angle of the thin film filter to the collimated light, an encoder of the galvanometer for producing an angle signal indicating an angle of the galvanometer, and a controller that compares the angle signal to a tuning function to produce a control function to drive the galvanometer;
    an interferometer including a reference arm and a sample arm and receiving light from the tunable laser; and
    a sensor for detecting an interference signal between light from the reference arm and the sample arm.

2. The system of claim 1, further comprising line forming optics between the tunable laser and the interferometer for converting the light from the tunable laser into a rectangular profile.

3. The system of claim 2, wherein an aspect ratio of the light from the line forming optics is at least 10 to 1.

4. The system of claim 1, wherein the sensor is a line scan sensor.

5. The system of claim 4, wherein the sensor is a linear array of at least 512 pixels.

6. The system of claim 1, wherein the light from the laser through the interferometer to the sensor travels in free space.

7. The system of claim 1, wherein the tuning function is a sawtooth waveform.

8. The system of claim 1, wherein the thin film bandpass filter is oriented to receive an S polarization from the gain chip.

9. The system of claim 1, wherein the gain chip is a single angled facet edge-emitting chip with an anti-reflective coated front facet and a curved ridge waveguide.

10. The system of claim 1, wherein the galvanometer tilts the thin film bandpass filter between the collimating lens and the focusing lens to achieve a tuning speed of between 3,000 nm/sec and 11,000 nm/sec.

11. A spectroscopy system, comprising:
    a tunable laser, including a gain chip; a collimating lens for collimating light from the gain chip, an end reflector, a focusing lens for focusing the collimated light on the end reflector, a thin film bandpass filter between the collimating lens and the focusing lens, a galvanometer for changing an angle of the thin film filter to the collimated light, an encoder of the galvanometer for producing an angle signal indicating an angle of the galvanometer, and a controller that compares the angle signal to a tuning function to produce a control function to drive the galvanometer;

a sample cell containing a sample;

a detector for detecting light from the tunable laser after passing through the sample cell; and a processor that controls the angle control actuator and monitors a time response of the detector to resolve an absorption spectrum of the sample.

12. The system of claim 11, wherein the gain chip is an InP chip.

13. The system of claim 11, wherein the gain chip is an GaSb chip.

14. The system of claim 11, wherein the thin film band-pass filter is oriented to receive an S polarization from the gain chip.

15. The system of claim 11, wherein the thin film band-pass filter is oriented to receive a P polarization from the gain chip.

* * * * *